United States Patent
Tanaka

(10) Patent No.: US 10,220,619 B2
(45) Date of Patent: *Mar. 5, 2019

(54) MEMS DEVICE, HEAD AND LIQUID JET DEVICE

(71) Applicant: Seiko Epson Corporation, Tokyo (JP)

(72) Inventor: Shuichi Tanaka, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/547,000

(22) PCT Filed: Mar. 3, 2016

(86) PCT No.: PCT/JP2016/001149
§ 371 (c)(1),
(2) Date: Jul. 27, 2017

(87) PCT Pub. No.: WO2016/139945
PCT Pub. Date: Sep. 9, 2016

(65) Prior Publication Data
US 2018/0001639 A1      Jan. 4, 2018

(30) Foreign Application Priority Data

Mar. 4, 2015   (JP) ................................ 2015-042852

(51) Int. Cl.
*B41J 2/14*   (2006.01)
*B41J 2/16*   (2006.01)
(Continued)

(52) U.S. Cl.
CPC ....... *B41J 2/14274* (2013.01); *B41J 2/14233* (2013.01); *B41J 2/161* (2013.01);
(Continued)

(58) Field of Classification Search
CPC ...... B41J 2/14; B41J 2/14072; B41J 2/14274; B41J 2002/14491; B41J 2/16;
(Continued)

(56) References Cited

U.S. PATENT DOCUMENTS

| 5,629,241 A * | 5/1997 | Matloubian | H01L 23/66 228/180.22 |
| 5,889,539 A * | 3/1999 | Kamoi | B41J 2/14233 347/50 |

(Continued)

FOREIGN PATENT DOCUMENTS

| EP | 1750304 A2 | 2/2007 |
| EP | 2778743 | 9/2014 |

(Continued)

OTHER PUBLICATIONS

International Search Report from PCT/JP2016/001149 dated May 31, 2016, 4 pages.

(Continued)

*Primary Examiner* — Anh T. N. Vo
(74) *Attorney, Agent, or Firm* — Workman Nydegger

(57) ABSTRACT

Provided are an MEMS device, a head, and a liquid jet device in which substrates are inhibited from warping, so that a primary electrode and a secondary electrode can be reliably connected to each other. Included are a primary substrate 30 provided with a bump 32 including a primary electrode 34, and a secondary substrate 10 provided with a secondary electrode 91 on a bottom surface of a recessed portion 36 formed by an adhesive layer 35. The primary substrate 10 and the secondary substrate 30 are joined together with the adhesive layer 35, the primary electrode 34 is electrically connected to the secondary electrode 91 with the bump 32 inserted into the recessed portion 36, and part of the bump 32 and the adhesive layer 35 forming the (Continued)

recessed portion 36 overlap each other in a direction in which the bump 32 is inserted into the recessed portion 36.

6 Claims, 11 Drawing Sheets

(51) Int. Cl.
*B81B 7/00* (2006.01)
*H05K 1/18* (2006.01)
*H01L 41/04* (2006.01)
*H01L 41/047* (2006.01)

(52) U.S. Cl.
CPC ........... *B41J 2/1607* (2013.01); *B41J 2/1623* (2013.01); *B41J 2/1626* (2013.01); *B41J 2/1631* (2013.01); *B81B 7/007* (2013.01); B41J 2002/14419 (2013.01); B41J 2002/14491 (2013.01); B81B 2201/052 (2013.01); B81B 2203/04 (2013.01); B81B 2207/012 (2013.01); H01L 41/042 (2013.01); H01L 41/0472 (2013.01); H05K 1/183 (2013.01)

(58) Field of Classification Search
CPC ...... B41J 2/1607; B41J 2/1609; B41J 2/1623; B41J 2/1631; B41J 2/164; B32B 7/12; B32B 15/02; B81B 7/007; B81B 2203/04; B81B 2201/052; B81B 2207/012
See application file for complete search history.

(56) References Cited

U.S. PATENT DOCUMENTS

| | | | |
|---|---|---|---|
| 6,011,313 A * | 1/2000 | Shangguan | H01L 23/49866 228/180.22 |
| 7,863,529 B2 | 1/2011 | Hashimoto | |
| 8,097,817 B2 | 1/2012 | Hashimoto | |
| 8,342,859 B2 | 1/2013 | Hashimoto | |
| 9,573,371 B2 * | 2/2017 | Hamaguchi | B41J 2/14201 |
| 9,744,764 B2 * | 8/2017 | Matsuo | B41J 2/14233 |
| 9,914,300 B2 * | 3/2018 | Hamaguchi | B41J 2/14233 |
| 2002/0158944 A1 | 10/2002 | Leu et al. | |
| 2003/0080397 A1 | 5/2003 | Sakuyama et al. | |
| 2003/0173597 A1 | 9/2003 | Kamiya | |
| 2004/0231878 A1 | 11/2004 | Higashida | |
| 2006/0196408 A1 | 9/2006 | Hashimoto | |
| 2006/0219356 A1 | 10/2006 | Tsumura | |
| 2006/0290747 A1 | 12/2006 | Shimada et al. | |
| 2007/0057371 A1 | 3/2007 | Hashimoto | |
| 2009/0114441 A1 | 5/2009 | Hashimoto | |
| 2009/0237454 A1 * | 9/2009 | Kanemoto | B41J 2/14233 347/47 |
| 2009/0309242 A1 | 12/2009 | Mizuno et al. | |
| 2011/0169897 A1 | 7/2011 | Yokoyama et al. | |
| 2011/0279717 A1 | 11/2011 | Wakiyama et al. | |
| 2012/0229554 A1 | 9/2012 | Goto | |
| 2014/0092177 A1 | 4/2014 | Sugahara et al. | |
| 2014/0144690 A1 | 5/2014 | Pares | |

FOREIGN PATENT DOCUMENTS

| | | |
|---|---|---|
| JP | 2008143011 | 6/2008 |
| JP | 2009-117544 | 5/2009 |
| JP | 2010-105298 A | 5/2010 |
| JP | 2012187891 | 10/2012 |
| JP | 2013-095088 | 5/2013 |
| JP | 2014-051008 | 3/2014 |
| JP | 2014051008 | 3/2014 |
| TW | 200715359 | 4/2007 |
| WO | 2011132516 | 10/2011 |

OTHER PUBLICATIONS

European Search Report issued in Application No. 16157279.7 dated Aug. 18, 2016.

* cited by examiner

[Fig. 1]
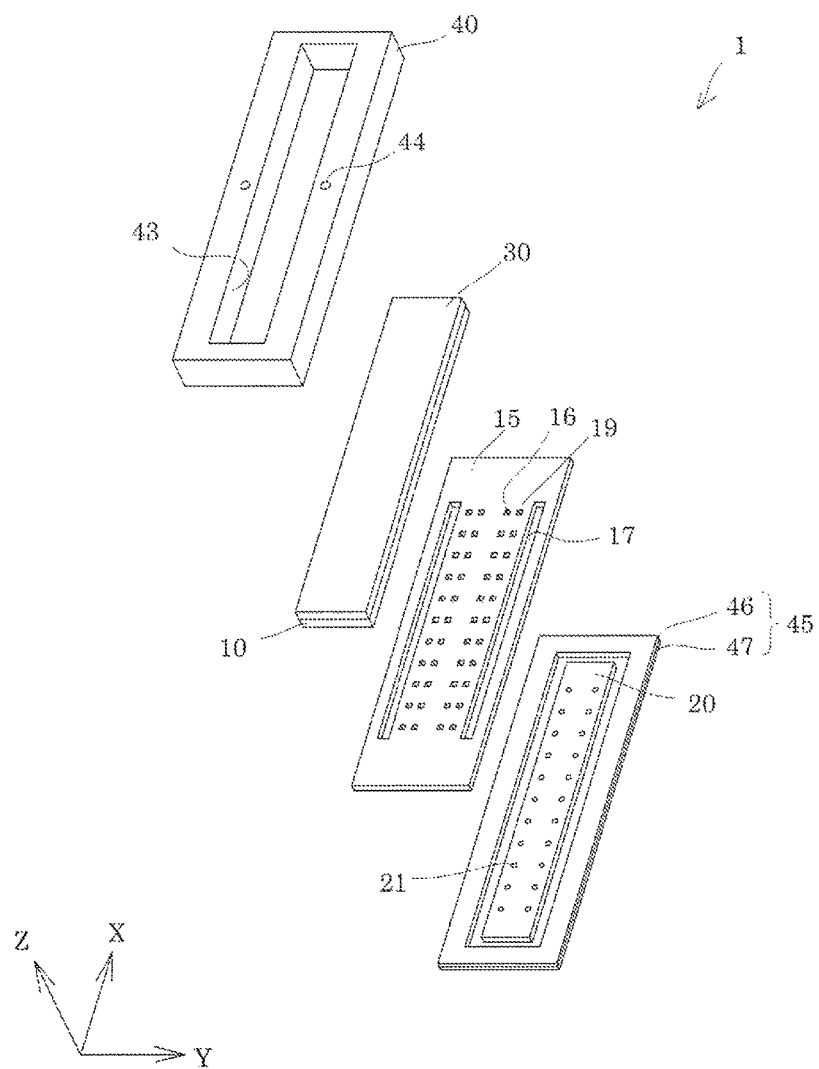

[Fig. 2]
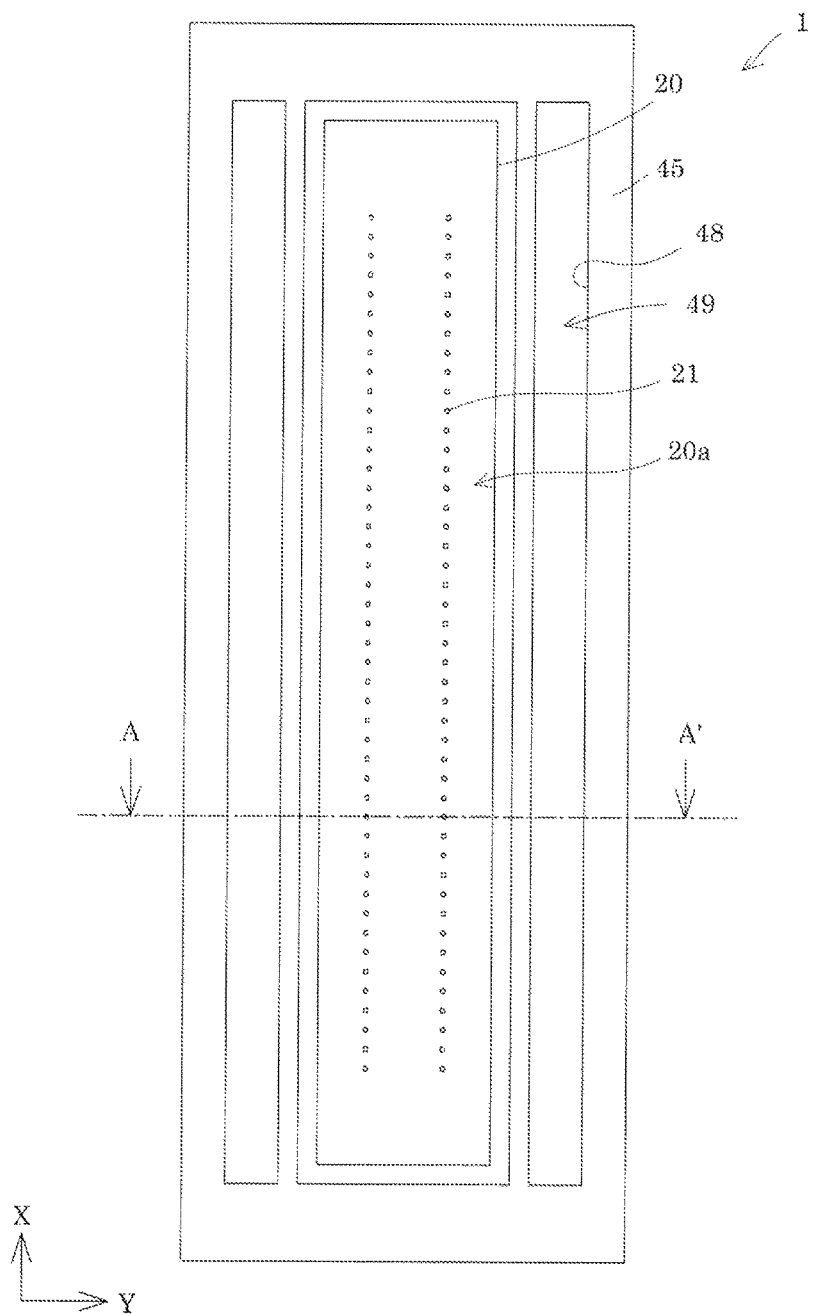

[Fig. 3]
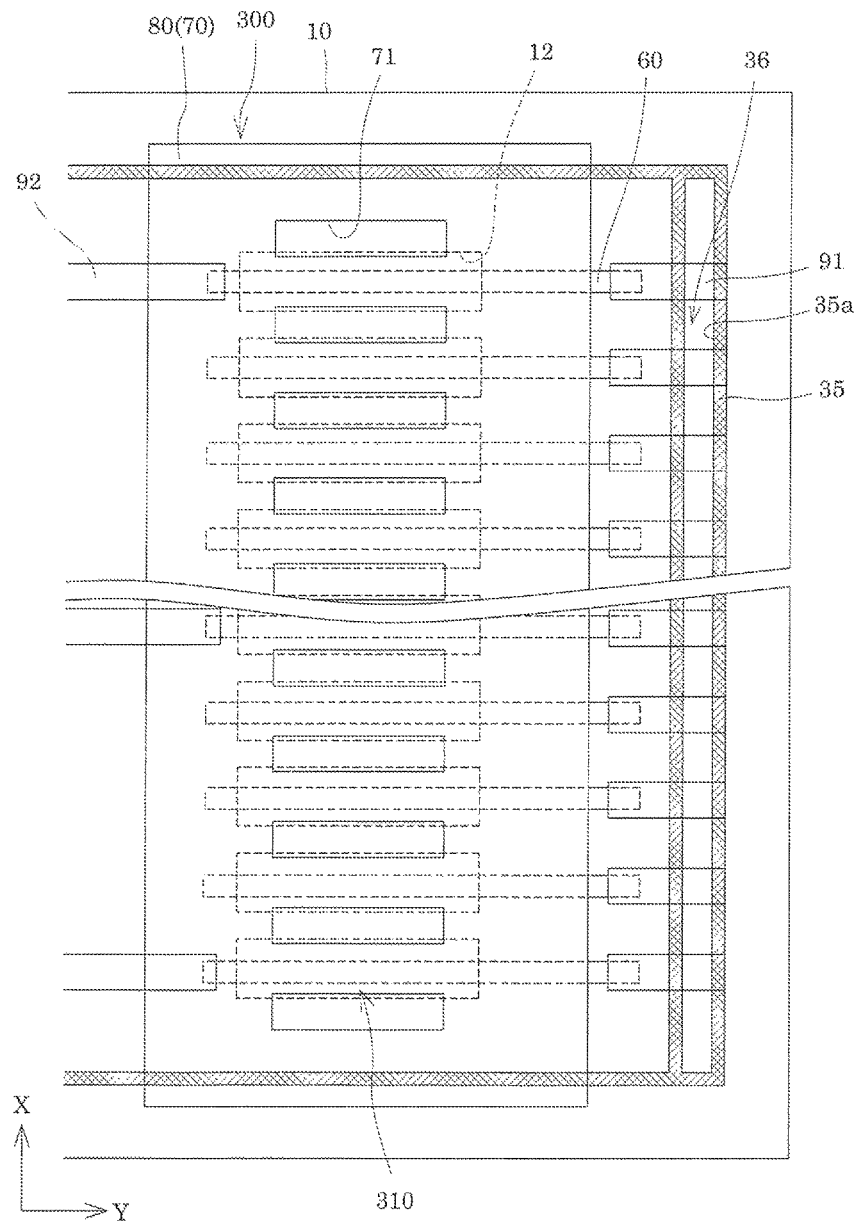

[Fig. 4]
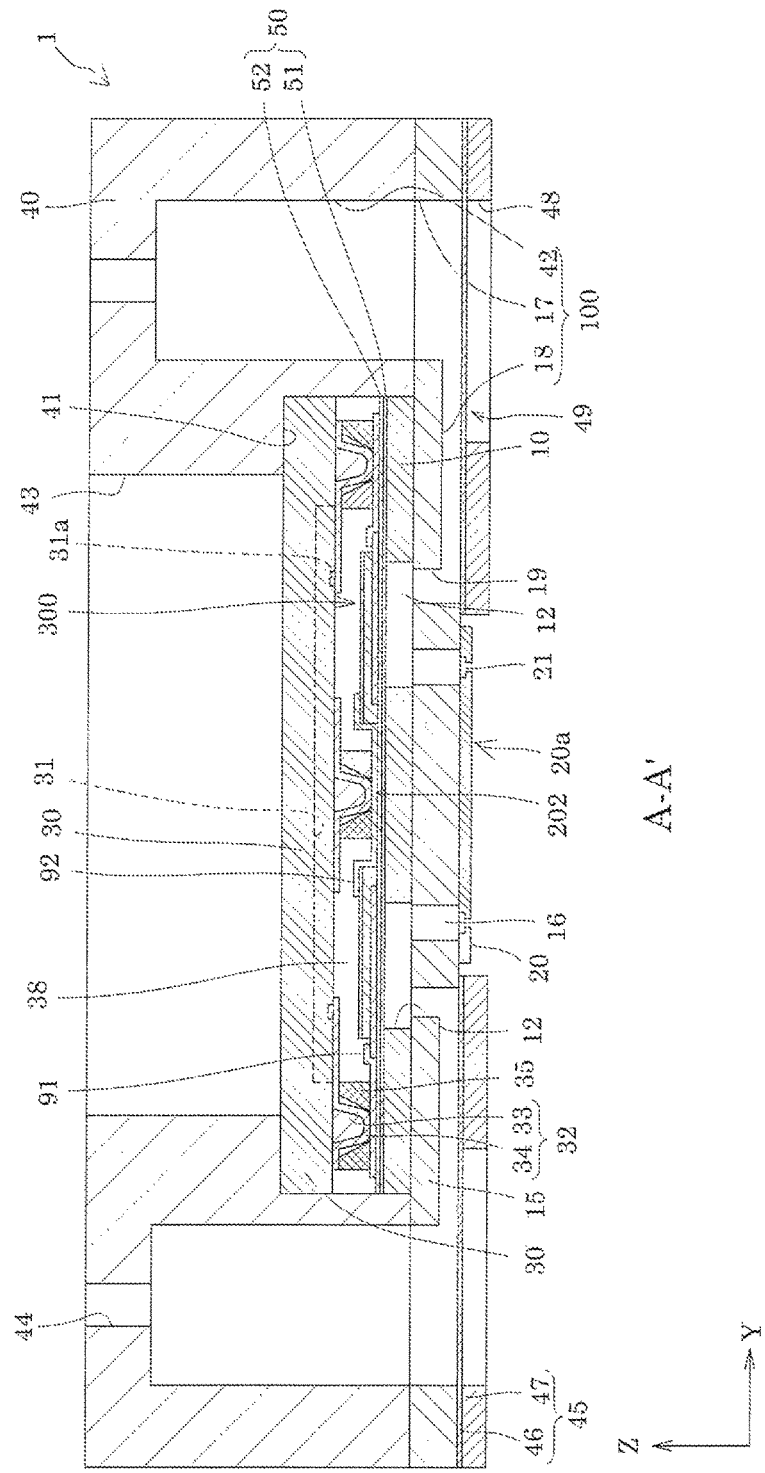

[Fig. 5A]
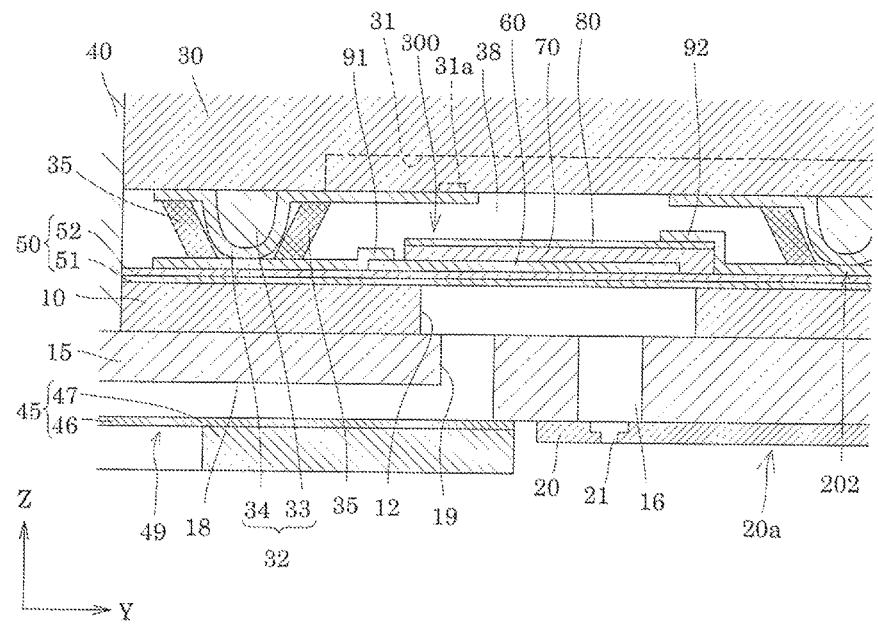
[Fig. 5B]
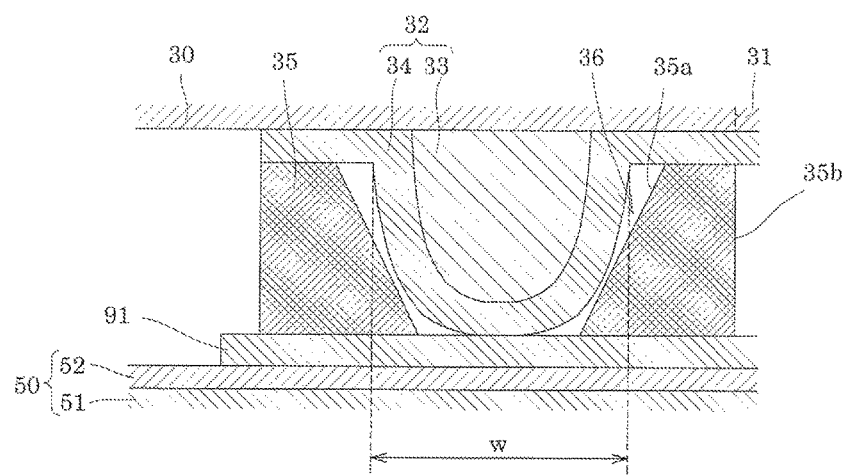

[Fig. 6]
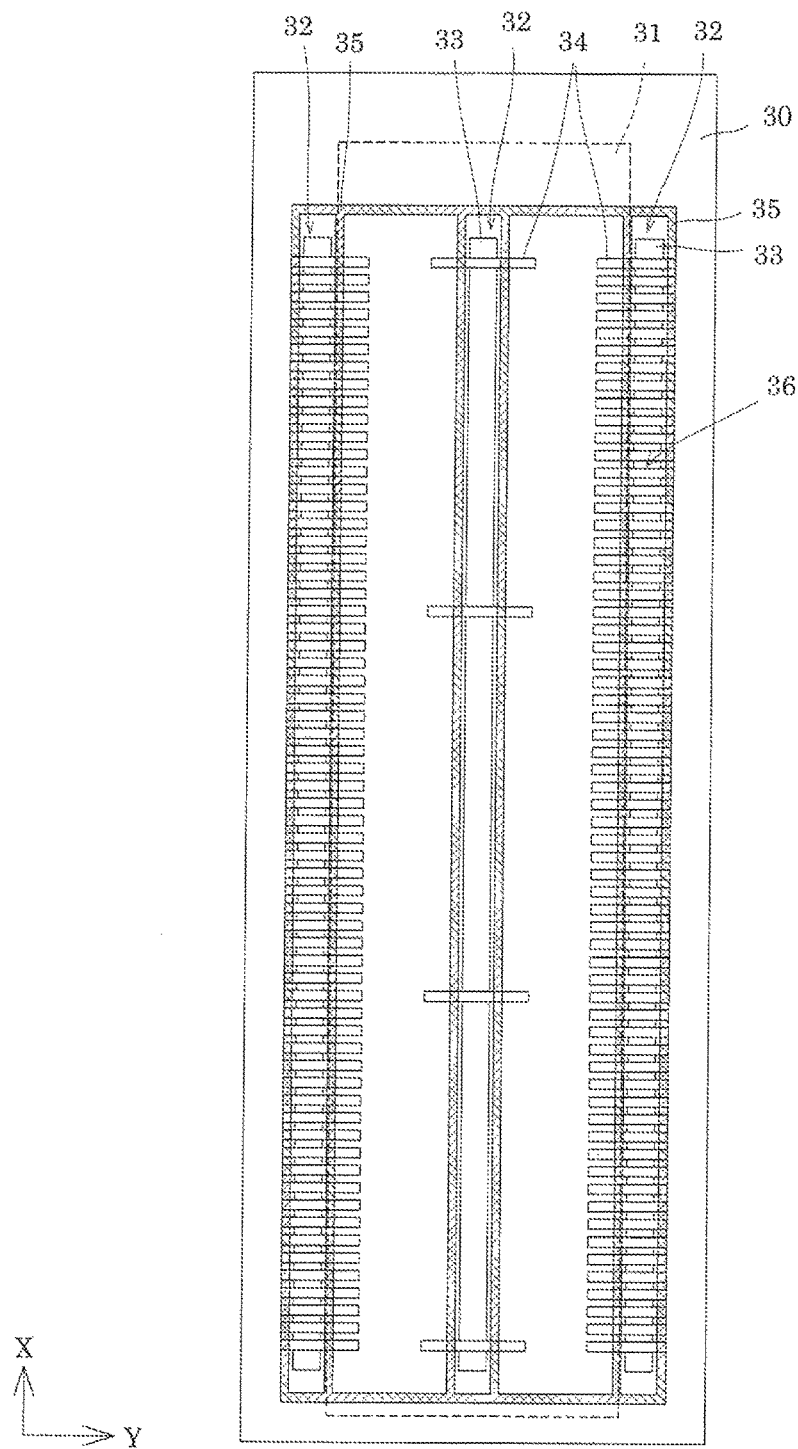

[Fig. 7]
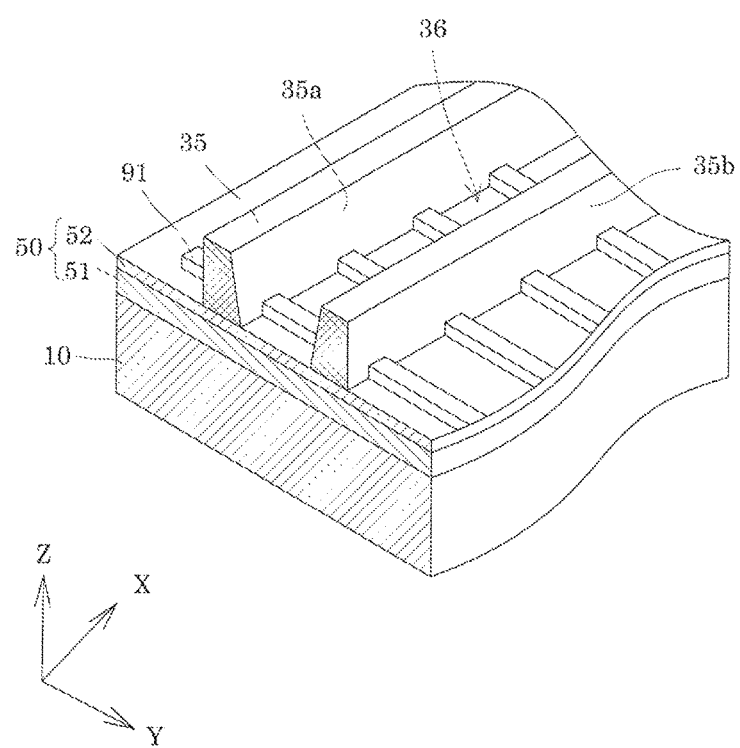

[Fig. 8]
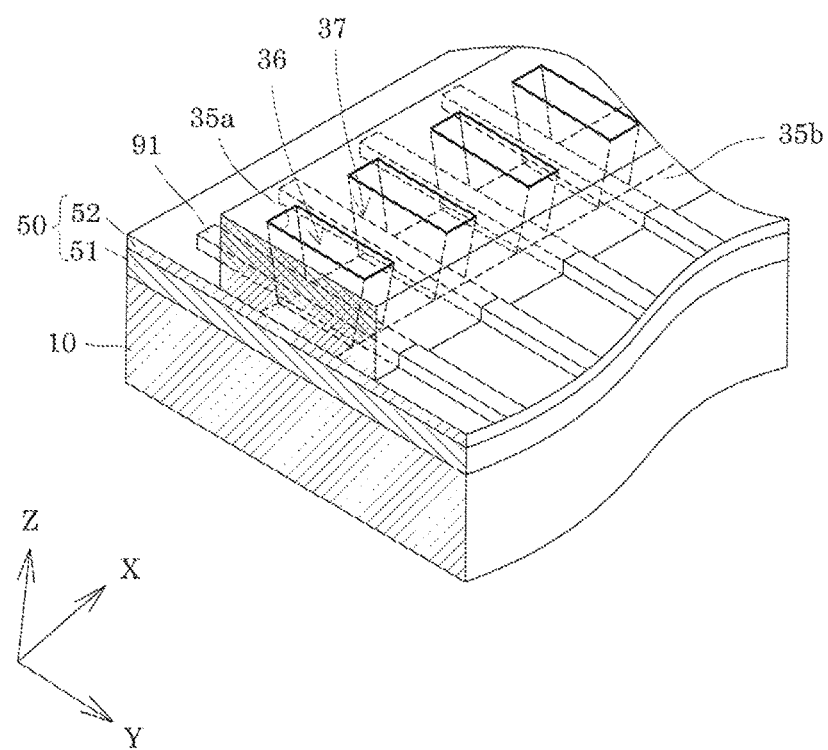

[Fig. 9A]
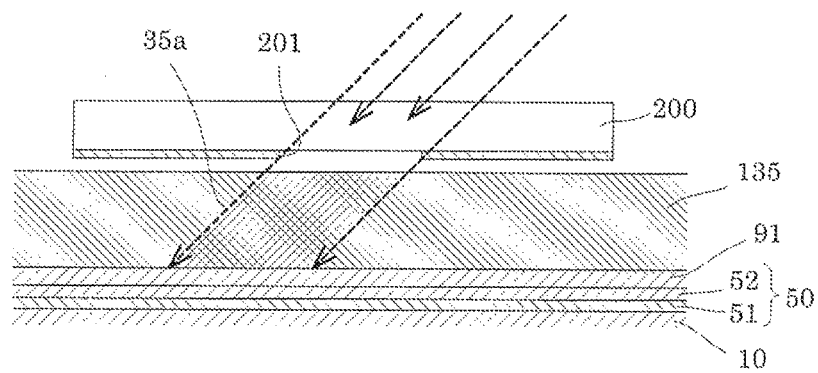
[Fig. 9B]
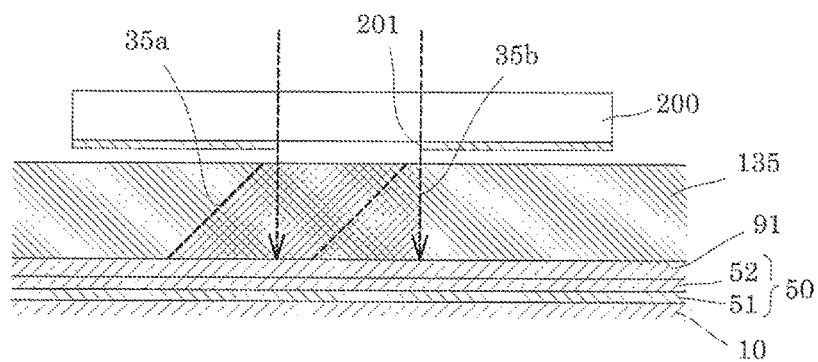
[Fig. 9C]
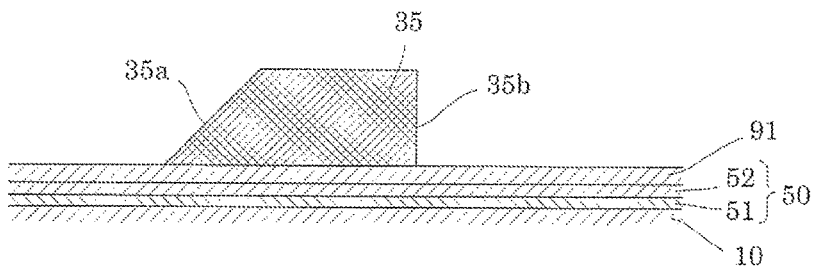

[Fig. 10A]
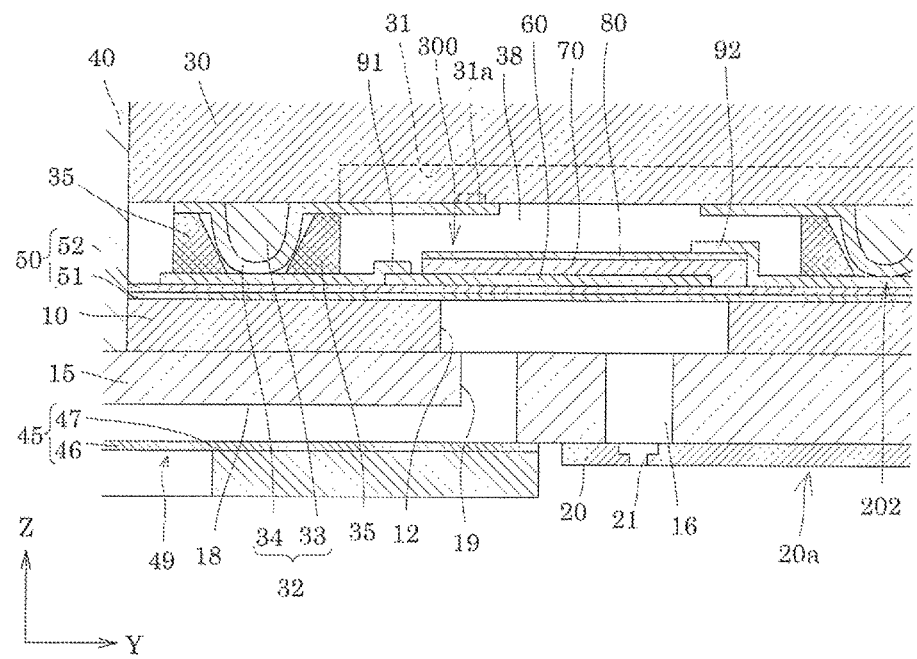
[Fig. 10B]
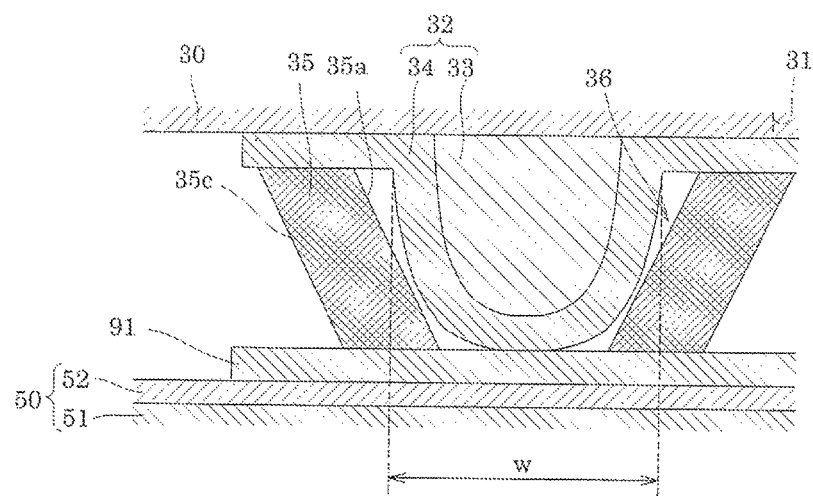

[Fig. 11]
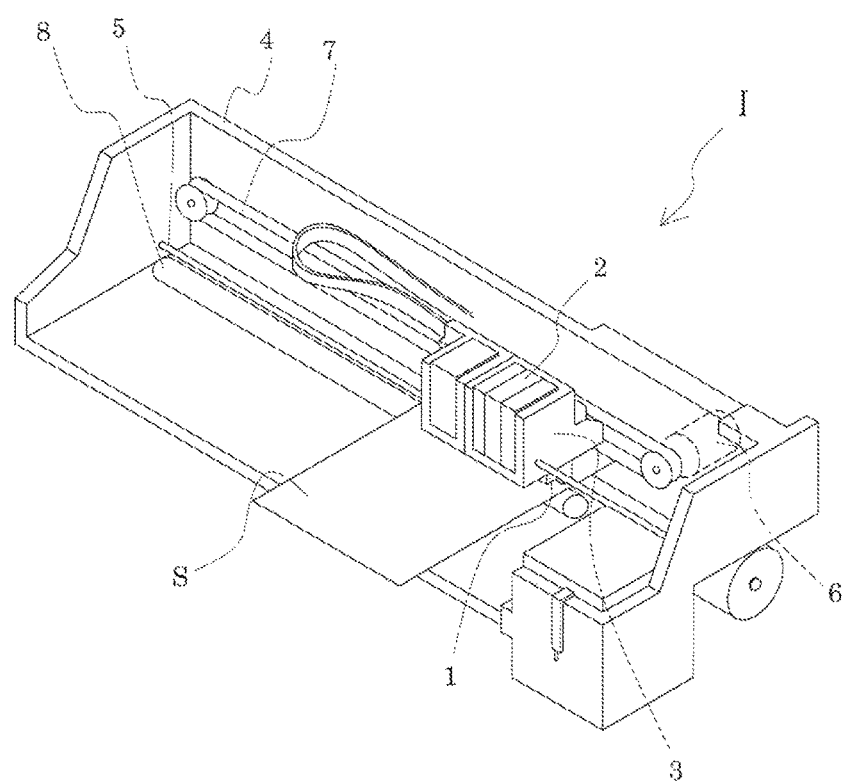

MEMS DEVICE, HEAD AND LIQUID JET DEVICE

TECHNICAL FIELD

The present invention relates to an MEMS device, a head including the MEMS device, and a liquid jet device including the head.

BACKGROUND ART

An inkjet-type recording head as one example of micro electro mechanical systems (MEMS) devices includes a passage-forming substrate in which pressure generating chambers communicating with nozzles for ejection of liquid droplets are formed, piezoelectric elements provided on one surface side of the passage-forming substrate, and a driver circuit substrate joined to the piezoelectric element side of the passage-forming substrate and provided with a driver circuit to drive the piezoelectric elements. The inkjet-type recording head drives the piezoelectric elements with the driver circuit, thereby generates pressure changes in liquid contained in the pressure generating chambers, and ejects liquid droplets from the nozzles.

As such piezoelectric elements, there has been proposed an element in a thin-film shape, which is formed on the passage-forming substrate by film deposition and lithography. Use of such piezoelectric elements in a thin-film shape carries an advantage in that the piezoelectric elements can be mounted at high density, but, on the other hand, makes it difficult to electrically connect the piezoelectric elements mounted at high density to the driver circuit.

To address this, there has been proposed a configuration in which bumps are provided on the driver circuit substrate, a recessed portion is provided in an adhesive layer for bonding the driver circuit substrate and the passage-forming substrate together, and the driver circuit and piezoelectric elements are electrically connected to each other via the bumps in the recessed portion (For example, see PTLs 1 and 2, and others).

By using bumps for connecting the driver circuit and the piezoelectric elements as described above, the piezoelectric elements arranged at high density and the driver circuit can be connected to each other easily at low cost.

SUMMARY OF INVENTION

Technical Problem

However, if the adhesive layer provided on both sides of the bump is arranged far from the bump, a problem arises in that the passage-forming substrate and the driver circuit substrate may warp.

To address this, the adhesive layer may be arranged in close proximity to the bump. In this case, however, another problem arises in that the adhesive layer may spread to the drive region of the piezoelectric elements and adversely affect the vibration properties of the piezoelectric elements.

In addition, if the bonding strength between the driver circuit substrate and the passage-forming substrate is low, another problem also arises in that the electrical connection between the bump and the piezoelectric elements is unstable.

It should be noted that these problems occur not only in the heads for ejecting liquids such as ink, but also in any MEMS devices other than the heads.

In view of these circumstances, the invention has an object to provide an MEMS device, a head, and a liquid jet device in which substrates are inhibited from warping, so that a primary electrode and a secondary electrode can be reliably connected to each other.

Solution to Problem

According to a first aspect of the invention to solve the aforementioned problems, provided is an MEMS device including: a primary substrate provided with a bump including a primary electrode; and a secondary substrate provided with a secondary electrode on a bottom surface of a recessed portion formed by an adhesive layer. The primary substrate and the secondary substrate are joined together with the adhesive layer, the primary electrode is electrically connected to the secondary electrode with the bump inserted into the recessed portion, and part of the bump and the adhesive layer forming the recessed portion overlap each other in a direction in which the bump is inserted into the recessed portion.

According to this aspect, primary electrodes and secondary electrodes arranged at high density can be connected via bumps reliably at low cost. In addition, since the adhesive layer forming the recessed portion and the bump overlap each other, the adhesive layer can be provided in close proximity to the bump, and can suppress a connection failure between the primary electrodes and the secondary electrodes by inhibiting the substrates from warping. Moreover, the overlapping of the adhesive layer with the bump enables downsizing of the substrates in comparison with the case where the adhesive layer is formed such that the recessed portion is widened outwardly.

Here, the bump preferably includes an elastic core portion and a metal film provided on the surface of the core portion. In this configuration, even when a passage-forming substrate and a driver circuit substrate warp or undulate, the core portion of the bump is deformed so that the bump and a piezoelectric element can be reliably connected to each other.

Moreover, it is preferable that the primary substrate be provided with a plurality of the primary electrodes, the core portion of the bump be provided independently for each of the primary electrodes, and the adhesive layer be provided between each pair of the core portions adjacent to each other. With this configuration, the bonded area of the adhesive layer can be enlarged without the substrates increased in size, and thereby the bonding strength can be enhanced.

In addition, the adhesive layer is preferably made of a photosensitive resin. This allows the adhesive layer to be formed in a desired shape easily with high accuracy.

According to a second aspect of the invention, provided is a head including the MEMS device of the first aspect; a pressure generating chamber formed in the secondary substrate and communicating with a nozzle; and a piezoelectric element attached to a primary substrate side of the secondary substrate, the piezoelectric element connected to the secondary electrode and configured to cause a pressure change in a liquid in the pressure generating chamber.

According to this aspect, since the adhesive layer forming the recessed portion and the bump overlap each other, the adhesive layer is not extended toward the piezoelectric element and thereby is inhibited from adhering to the piezoelectric element. Thus, the adhesive layer is inhibited from blocking displacement of the piezoelectric element.

Moreover, according to a third aspect of the invention, provided is a liquid jet device including the head of the second aspect.

According to this aspect, it is possible to realize a liquid jet device which can establish a reliable connection between electrodes, be downsized, and be inhibited from blocking displacement of the piezoelectric element.

BRIEF DESCRIPTION OF DRAWINGS

FIG. 1 is a perspective exploded view of a head according to Embodiment 1.

FIG. 2 is a plan view of the head according to Embodiment 1.

FIG. 3 is a plan view of an important portion of a passage-forming substrate according to Embodiment 1.

FIG. 4 is a cross sectional view of the head according to Embodiment 1.

FIG. 5A is an enlarged cross sectional view of an important portion of the head according to Embodiment 1.

FIG. 5B is an enlarged cross sectional view of an important portion of the head according to Embodiment 1.

FIG. 6 is a plan view of a driver circuit substrate according to Embodiment 1.

FIG. 7 is a perspective view of an important portion of a passage-forming substrate according to Embodiment 1.

FIG. 8 is a perspective view of an important portion of a passage-forming substrate according to Embodiment 1.

FIG. 9A is a cross sectional view illustrating a method of producing an adhesive layer according to Embodiment 1.

FIG. 9B is a cross sectional view illustrating a method of producing an adhesive layer according to Embodiment 1.

FIG. 9C is a cross sectional view illustrating a method of producing an adhesive layer according to Embodiment 1.

FIG. 10A is a cross sectional view of an important portion of a head according to Embodiment 2.

FIG. 10B is a cross sectional view of an important portion of a head according to Embodiment 2.

FIG. 11 is a schematic view of a recording apparatus according to one embodiment.

DESCRIPTION OF EMBODIMENTS

Hereinafter, the invention is described in detail based on embodiments.

Embodiment 1

FIG. 1 is a perspective exploded view of an inkjet-type recording head which is an example of a head according to Embodiment 1 of the invention, and FIG. 2 is a plan view of the inkjet-type recording head. FIG. 3 is a plan view of an important portion of a passage-forming substrate, FIG. 4 is a cross sectional view taken along a line A-A' in FIG. 2, and FIGS. 5A and 5B are enlarged cross sectional views of important portions of FIG. 4.

As illustrated in the drawings, an inkjet-type recording head 1 which is the example of the head of this embodiment includes multiple components such as a passage-forming substrate 10 as a secondary substrate, a communicating plate 15, a nozzle plate 20, a driver circuit substrate 30 as a primary substrate, and a compliance plate 45.

The passage-forming substrate 10 may be made of any of metals such as a stainless steel and Ni, ceramic materials typified by $ZrO_2$ and $Al_2O_3$, glass ceramic materials, oxides such as MgO and $LaAlo_3$, and others. In this embodiment, the passage-forming substrate 10 is made of a single crystal silicon substrate. The passage-forming substrate 10 is anisotropically etched from one surface side thereof, and multiple pressure generating chambers 12 defined by compartment walls are formed in the passage-forming substrate 10 as illustrated in FIGS. 4 and 5A. The pressure generating chambers 12 are arrayed side by side in a direction in which multiple nozzles 21 that eject ink are arrayed side by side. Hereinafter, this direction is referred to as an array direction or a first direction X of the pressure generating chambers 12.

In addition, the passage-forming substrate 10 is provided with multiple arrays of pressure generating chambers 12 arrayed in the first direction X, specifically two arrays in this embodiment. An array arrangement direction in which the multiple arrays of pressure generating chambers 12 arrayed in the first direction X are arranged side by side is referred to as a second direction Y below. Moreover, a direction orthogonal to both the first direction X and the second direction Y is referred to as a third direction Z in this embodiment. Note that, although the directions (X, Y, Z) are defined as being orthogonal to each other in this embodiment, the arrangement relations among the components are not necessarily limited to orthogonal ones.

In addition, in the passage-forming substrate 10, a supply path or the like may be provided at one end side of each pressure generating chamber 12 in the second direction Y, the supply path having a narrower opening area than the pressure generating chamber 12, and configured to apply path resistance to ink to flow into the pressure generating chamber 12.

Moreover, the communicating plate 15 and the nozzle plate 20 are laminated in this order on the one surface side of the passage-forming substrate 10 (in a laminate direction, that is, −Z direction). More specifically, the inkjet-type recording head 1 includes the communicating plate 15 provided on the one surface side of the passage-forming substrate 10, and the nozzle plate 20 provided on the opposite surface side of the communicating plate 15 from the passage-forming substrate 10 and having the nozzles 21.

The communicating plate 15 is provided with nozzle communicating paths 16 through which the pressure generating chambers 12 and the nozzles 21 respectively communicate with each other. The communicating plate 15 has a larger area than the passage-forming substrate 10, and the nozzle plate 20 has a smaller area than the passage-forming substrate 10. With the communicating plate 15 thus provided, the nozzles 21 in the nozzle plate 20 can be arranged away from the pressure generating chambers 12. In this configuration, although ink around the nozzles 21 may increase in viscosity due to evaporation of moisture in the ink, the ink inside the pressure generating chambers 12 may be less affected by the viscosity increase. In addition, since the nozzle plate 20 only has to cover the openings of the nozzle communicating paths 16 through which the pressure generating chambers 12 and the nozzles 21 communicate with each other, the area of the nozzle plate 20 can be made relatively small, which may lead to cost reduction. In this embodiment, a surface of the nozzle plate 20 to which the nozzles 21 are opened and through which to eject ink droplets is referred to as liquid ejecting surface 20a.

Moreover, the communicating plate 15 is provided with first manifold portions 17 and second manifold portions 18 which constitute part of manifolds 100.

The first manifold portions 17 are bored through the communicating plate 15 in a thickness direction (the laminate direction in which the communicating plate 15 is laminated on the passage-forming substrate 10).

Meanwhile, the second manifold portions 18 are not bored through the communicating plate 15 in the thickness direction, but are only opened to the nozzle plate 20 side of the communicating plate 15.

Moreover, the communicating plate 15 is provided with supply communicating paths 19 respectively communicating with one end portions of the pressure generating chambers 12 in the second direction Y. Each supply communicating path 19 is provided independently for one of the pressure generating chambers 12. Through the supply communicating paths 19, the second manifold portions 18 and the pressure generating chambers 12 communicate with each other.

The communicating plate 15 as described above may be made of any of metals such as a stainless steel and Ni, ceramics such as zirconium, and others. Preferably, the communicating plate 15 is made of a material having a linear expansion coefficient equivalent to that of the passage-forming substrate 10. Specifically, if the communicating plate 15 is made of a material having a linear expansion coefficient largely different from that of the passage-forming substrate 10, a difference between their linear expansion coefficients may cause the passage-forming substrate 10 and the communicating plate 15 to warp due to heating and cooling. In this embodiment, the communicating plate 15 is made of the same material as that for the passage-forming substrate 10, i.e., the single crystal silicon substrate, whereby warping due to heating or any other thing such as a crack or delamination due to heating is inhibited from occurring.

The nozzle plate 20 is provided with the nozzles 21 communicating the respective pressure generating chambers 12 via the nozzle communicating paths 16. The nozzles 21 thus formed are arrayed side by side in the first direction X, and two arrays of the nozzles 21 arrayed in the first direction are arranged side by side in the second direction Y.

Such nozzle plate 20 may be made of any of metals such as a stainless steel (SUS), organic materials such as a polyimide resin, single crystal silicon substrates and others, for example. Incidentally, if the nozzle plate 20 is made of a single crystal silicon substrate, the nozzle plate 20 and the communicating plate 15 have equivalent linear expansion coefficients, and thus can be inhibited from warping due to heating and cooling, or causing any other thing such as a crack or delamination due to heating.

On the other hand, a vibration plate 50 is formed on the surface of the passage-forming substrate 10 on the opposite side from the communicating plate 15. In this embodiment, the vibration plate 50 includes an elastic film 51 provided on the passage-forming substrate 10 side and made of silicon oxide, and an insulation film 52 provided on the elastic film 51 and made of zirconium oxide. Here, the liquid passages such as the pressure generating chambers 12 are formed by anisotropic etching performed on the passage-forming substrate 10 from the one surface side (the surface side to which the nozzle plate 20 is joined), and the opposite surface side of the liquid passages such as the pressure generating chambers 12 is defined by the elastic film 51.

In addition, piezoelectric actuators 300 as piezoelectric elements of this embodiment are provided on the vibration plate 50 of the passage-forming substrate 10. Each piezoelectric actuator 300 includes a first electrode 60, a piezoelectric layer 70, and a second electrode 80 which are laminated in this order from the vibration plate 50 side. In this embodiment, the first electrode 60 included in the piezoelectric actuator 300 is cut for each of the pressure generating chambers 12, and constitutes an independent individual electrode for each active portion that is an essential drive portion of the piezoelectric actuator 300. In the first direction X of the pressure generating chamber 12, the first electrode 60 is formed with a narrower width that the width of the pressure generating chamber 12. Specifically, both ends of the first electrode 60 in the first direction X of the pressure generating chamber 12 are located inside a region facing the pressure generating chamber 12. Meanwhile, both ends of the first electrode 60 in the second direction Y of the pressure generating chamber 12 are extended to the outside of the pressure generating chamber 12. A material for the first electrode 60 thus formed may be any metal material particularly not limited, and platina (Pt), iridium (Ir), or the like is preferably used, for example.

The piezoelectric layer 70 is formed with a predetermined width in the second direction Y and is extended continuously along the first direction X. The width of the piezoelectric layer 70 in the second direction Y is wider than the width of the pressure generating chambers 12 in the second direction Y. Thus, the piezoelectric layer 70 is extended over an outside region of the pressure generating chambers 12 in the second direction Y of the pressure generating chambers 12.

On one end side of the pressure generating chambers 12 in the second direction Y (on the opposite side from the manifold 100), an end of the piezoelectric layer 70 is located outside of ends of the first electrodes 60. In other words, the ends of the first electrodes 60 are covered with the piezoelectric layer 70. On the other end side of the pressure generating chambers 12 in the second direction Y which is on the manifold 100 side, an end of the piezoelectric layer 70 is located inside of ends of the first electrodes 60 (on the pressure generating chamber 12 side), and the ends of the first electrodes 60 on the manifold 100 side are not covered with the piezoelectric layer 70.

The piezoelectric layer 70 is made of a piezoelectric material which is an oxide formed on the first electrodes 60 and having a polarization structure, and for example is made of a perovskite oxide represented by a general chemical formula $ABO_3$. The perovskite oxides usable for the piezoelectric layer 70 include, for example, lead-based piezoelectric materials containing lead, non-lead-based piezoelectric materials not containing lead, and others.

The piezoelectric layer 70 thus formed is provided with recessed portions 71 corresponding to the respective compartment walls. A width of each recessed portion 71 in the first direction X is approximately equal to or wider than a width of each compartment wall in the first direction X. These recessed portions 71 lowers the stiffness in portions of the vibration plate 50 facing both ends of the pressure generating chambers 12 in the second direction Y (what is termed as arm portions of the vibration plate 50), so that the piezoelectric actuators 300 can be displaced favorably. Note that the formation of the recessed portions 71 in the piezoelectric layer 70 is not only the way to displace the piezoelectric actuators 300 favorably. The piezoelectric layer 70 may be formed in any manner without having the recessed portions 71 formed therein, if the piezoelectric layer 70 can allow the piezoelectric actuators 300 to be displaced desirably.

The second electrode 80 is provided on the opposite surface side of the piezoelectric layer 70 from the first electrode 60, and constitutes a common electrode which is common to multiple active portions. Incidentally, it is a design option whether to form the second electrode 80 on inner surfaces of the recessed portions 71, that is, side surfaces of the recessed portions 71 of the piezoelectric layer 70.

The piezoelectric actuator 300 thus including the first electrode 60, the piezoelectric layer 70, and the second electrode 80 is displaced with application of a voltage between the first electrode 60 and the second electrode 80. To put it differently, the application of the voltage between the two electrodes 60 and 80 causes piezoelectric strain in the piezoelectric layer 70 sandwiched between the first electrode 60 and second electrode 80. Here, a portion of the piezoelectric layer 70 where piezoelectric strain occurs with application of the voltage between the two electrodes is referred to as an active portion. In contrast, a portion of the piezoelectric layer 70 where no piezoelectric strain occurs is referred to as an inactive portion.

In addition, as illustrated in FIGS. 3, 4, and 5A, individual wirings 91 as lead wirings are drawn from the first electrodes 60 of the piezoelectric actuators 300. In this embodiment, the two arrays of the piezoelectric actuators 300 (active portions) arrayed side by side in the first direction X are arranged side by side in the second direction Y, and the individual wirings 91 are drawn out from the respective piezoelectric actuators 300 of each array to the outside of the array in the second direction Y. Common wirings 92 as lead wirings are drawn from the second electrodes 80 of the piezoelectric actuators 300. In this embodiment, each of the common wirings 92 is in conduction with the second electrodes 80 of both the two arrays of the piezoelectric actuators 300. In addition, the common wirings 92 are provided at a ratio of one common wiring 92 to several active portions. In this embodiment, the individual wirings 91 drawn from the first electrodes 60 of the piezoelectric actuators 300 and the common wirings 92 drawn from the second electrodes 80 of the piezoelectric actuators 300 are referred to as secondary electrodes. In summary, the passage-forming substrate 10 as the secondary substrate is provided with the individual wirings 91 and the common wirings 92 as the secondary electrodes.

Meanwhile, the driver circuit substrate 30 is joined to the surface of the passage-forming substrate 10 on the piezoelectric actuator 300 side. The driver circuit substrate 30 has a substantially same size as the passage-forming substrate 10.

Here, the driver circuit substrate 30 as the primary substrate in this embodiment is described with reference to FIGS. 4, 5A, 5B, and 6. FIG. 6 is a plan view of the driver circuit substrate viewed from the passage-forming substrate side.

As illustrated in the drawings, the driver circuit substrate 30 as the primary substrate in this embodiment is a semiconductor substrate in which a driver circuit 31 as an integrated circuit including a switching element such as a transmission gate is formed by semiconductor manufacturing processes, and is not a substrate provided with wirings on which a semiconductor integrated circuit separately fabricated is mounted, for example.

The driver circuit 31 is integrally formed on a surface side of the driver circuit substrate 30 to face the passage-forming substrate 10. Then, the driver circuit substrate 30 and the passage-forming substrate 10 are joined together with an adhesive layer 35.

Here, the driver circuit 31 of the driver circuit substrate 30 is connected to the individual wirings 91 and the common wirings 92 of the passage-forming substrate 10 via bumps 32. In this embodiment, the bumps 32 are provided on the surface of the driver circuit substrate 30 to face the passage-forming substrate 10. Here, the bumps 32 include primary electrodes electrically connected to terminals 31a of the driver circuit 31. Then, the bumps 32 are electrically connected to the individual wirings 91 and the common wirings 92, so that the driver circuit 31 is electrically connected to the first electrodes 60 and the second electrodes 80 of the piezoelectric actuators 300.

The bumps 32 each include a core portion 33 formed of an elastic resin material, and a metal film 34 formed on a surface of the core portion 33, for example. The metal film 34 is provided to extend from the surface of the core portion 33 onto the surface of the driver circuit substrate 30 on the passage-forming substrate 10 side. The metal film 34 is electrically connected to the corresponding terminal 31a of the driver circuit 31 of the driver circuit substrate 30. In short, the metal film 34 is provided as a primary electrode in this embodiment.

The core portion 33 is made of a photosensitive insulation resin or a thermosetting insulation resin such as a polyimide resin, an acryl resin, a phenolic resin, a silicone resin, a silicone-modified polyimide resin, or an epoxy resin.

The core portion 33 thus formed has an almost hog-backed shape before the driver circuit substrate 30 and the passage-forming substrate 10 are joined together. Here, the hog-back shape is a columnar shape in which an inner surface (bottom surface) in contact with the driver circuit substrate 30 is a flat surface, and an outer surface being a non-contact surface is a curved surface. A specific example of the almost hog-backed shape is a shape having an almost semicircular, almost semi-elliptic, or almost trapezoidal cross section, or any other similar shape.

Then, when the driver circuit substrate 30 and the passage-forming substrate 10 are pressed against each other so as to come closer to each other, the core portions 33 are elastically deformed such that the profiles of the tip ends of the core portions 33 follow the surface profiles of the individual wirings 91 and the common wirings 92.

Thus, even when the driver circuit substrate 30 and the passage-forming substrate 10 warp or undulate, the core portions 33 are deformed so as to follow the warping or undulation, and thereby can establish the reliable connection of the bumps 32 with the individual wirings 91 and the common wirings 92.

Note that the core portions 33 are continuously extended on a straight line in the first direction X in this embodiment. Specifically, three core portions 33 in total are provided, two of which are provided outside of the two arrays of the piezoelectric actuators 300 in the second direction Y, and one of which is provided between the two arrays of the piezoelectric actuators 300 in the second direction Y. Each of the core portions 33 provided outside of the two arrays of the piezoelectric actuators 300 forms the bump 32 to be connected to the individual wirings 91 of the corresponding array of the piezoelectric actuators 300, and the core portion 33 provided between the two arrays of the piezoelectric actuators 300 forms the bump 32 to be connected to the common wirings 92 of the two arrays of the piezoelectric actuators 300.

The foregoing core portions 33 may be formed by a photolithography technique, or an etching technique.

The metal films 34 cover portions of the surfaces of the core portions 33. The metal films 34 may include only a single layer or multiple laminated layers made of any one of or any combination of metals and alloys such as Au, Tiw, Cu, Cr (chrome), Ni, Ti, W, NiV, Al, Pd (palladium), and lead-free solder alloys, for example. Then, with the core portions 33 elastically deformed, the metal films 34 are also deformed so as to follow the surface profiles of the individual wirings 91 and the common wirings 92 and are metal-joined to the individual wirings 91 and the common wirings 92. Here, the metal films 34 to be connected to the individual wirings 91 are arranged on the surfaces of the core portions 33 at the same pitch as the individual wirings 91 in the first direction X. Meanwhile, the metal films 34 to be connected to the common wirings 92 are arranged on the surface of the core portion 33 at the same pitch as the common wirings 92 in the first direction X.

In such bumps 32 of this embodiment, the metal films 34 provided on the surfaces of the core portions 33 are joined to the individual wirings 91 and the common wirings 92 at room temperature. Specifically, the driver circuit substrate 30 and the passage-forming substrate 10 in this embodiment are joined together with the adhesive layer 35, and thereby the bumps 32 are fixed to the individual wirings 91 and the common wirings 92 while being in contact with the wirings 91, 92. Here, the adhesive layer 35 may be made of an adhesive agent, a resist material or the like having certain adhesive properties and containing a resin which contains, as a main ingredient, an epoxy resin, an acryl resin, a phenolic resin, a polyimide resin, a silicone resin, a styrene resin, or the like. The adhesive layer 35 can be formed easily with high accuracy by using a photosensitive resin for use as a photoresist, in particular. More specifically, if an adhesive agent having a low viscosity is used as the adhesive layer 35, the adhesive agent may spread over the active portions of the piezoelectric actuators 300 and the vibration plate 50 on which the active portions are provided, and then the adhesive agent may block displacement of the piezoelectric actuators 300. However, if a photosensitive resin for use as a photoresist or the like is used as the adhesive layer 35, the adhesive layer 35 can be formed only in a desired region. In this case, the adhesive agent may be inhibited from spreading and thus from blocking displacement of the piezoelectric actuators 300. Incidentally, photosensitive resins such as SU_83000 (made by Nippon Kayaku Co., Ltd.), SU-8_3000CF (made by Nippon Kayaku Co., Ltd.), and TMMR_s2000 (made by TOKYO OHKA KOGYO CO., LTD.) are examples of the photosensitive resin usable as the adhesive layer 35.

In this embodiment, the adhesive layer 35 is provided on both sides of each of the bumps 32, that is, on both sides across the bump 32 in the second direction Y. To be more specific, a recessed portion 36 is formed between two lines of the adhesive layer 35, while the individual wirings 91 or the common wirings 92 as the secondary electrodes are provided on a bottom surface of the recessed portion 36, that is, on the vibration plate 50 of the passage-forming substrate 10. Then, the bump 32 is connected to the individual wirings 91 or the common wirings 92 in the recessed portion 36. In this embodiment, the three bumps 32 extending in the first direction X are arranged side by side in the second direction Y. Accordingly, to form the recessed portion 36 for each bump 32, two lines of the adhesive layer 35 are provided to extend in the first direction X on both sides of each bump 32 in the second direction Y. In short, six lines of the adhesive layer 35 extending in the first direction X are provided in the second direction Y. Then, two more lines of the adhesive layer 35 are provided such that the six lines of the adhesive layer 35 arranged side by side in the second direction Y are connected continuously at both ends in the first direction X. In other words, the adhesive layer 35 is provided in a rectangular frame-like shape in plan view in which the adhesive layer 35 surrounds the entire periphery of the two arrays of the piezoelectric actuators 300 while surrounding each of the arrays of the piezoelectric actuators 300.

In addition, the adhesive layer 35 overlaps part of each bump 32 in the third direction Z. Specifically, as illustrated in FIG. 5B, a width of the adhesive layer 35 in the second direction Y extends into a region w in which the passage-forming substrate 10 and the bump 32 face each other in the third direction Z. To be more specific, "the adhesive layer 35 overlaps part of each bump 32" means that part of the adhesive layer 35 and part of the bump 32 coincide with each other in plan view seen in the third direction Z. Note that, in this embodiment, the bump 32 described herein is a portion protruding from the driver circuit substrate 30 toward the passage-forming substrate 10, and defines the region w including the core portion 33 and the portion of the metal film 34 provided on the surface of the core portion 33. Meanwhile, the adhesive layer 35 has a trapezoidal cross section, more specifically, the cross section of the adhesive layer 35 taken in the second direction Y becomes wider toward the passage-forming substrate 10 side and becomes narrower toward the driver circuit substrate 30 side. In other words, the adhesive layer 35 is provided such that inner surfaces 35a forming the recessed portion 36 are inclined with respect to the third direction Z. In this embodiment, the inner surfaces 35a are inclined to come closer to the bump 32 while extending toward the passage-forming substrate 10 side, so that the part of the adhesive layer 35 is placed inside the region w of the bump 32. Moreover, the adhesive layer 35 is provided such that the inner surfaces 35a of the recessed portion 36 are inclined while being kept out of contact with the bump 32. This is because, if the adhesive layer 35 is in contact with the bump 32, for example, the hardened adhesive layer 35 may hinder deformation of the bump 32. More specifically, if the adhesive layer 35 is in contact with a side surface of the bump 32, the adhesive layer 35 may hinder the bump 32 from being deformed to follow the individual wirings 91 or the common wirings 92, and resultantly may cause a connection failure due to a decrease in the contact areas between the bump 32 and the individual wirings 91 or the common wirings 92. In addition, if the adhesive layer 35 in contact with part of the bump 32 is hardened, a load due to deformation is applied to the other part of the bump 32 out of contact with the adhesive layer 35, and the bump 32 and the individual wirings 91 or the common wirings 92 cannot be connected together under the same load over the multiple connection portions. In this embodiment, a gap is provided between the adhesive layer 35 and the bump 32 so as to keep the adhesive layer 35 out of contact with the bump 32. Thus, the adhesive layer 35 is inhibited from hindering deformation of bumps 32, and electrical connection of the bumps 32 with the individual wirings 91 and the common wirings 92 is reliably established.

The inclination of the inner surfaces 35a of the recessed portion 36 described above makes the bump 32 come close to a bonded region where the adhesive layer 35 and the passage-forming substrate 10 are bonded together, and thus a region of the passage-forming substrate 10 in contact with the bump 32 can be inhibited from warping. Incidentally, if the bump 32 is far from the bonded region of the passage-forming substrate 10 and the adhesive layer 35 forming the recessed portion 36, the passage-forming substrate 10 within the recessed portion 36 may warp due to pressure applied by the bump 32, and a connection failure between the bump 32 and the individual wirings 91 or the common wirings 92 may occur. In this embodiment, the passage-forming substrate 10 is thus inhibited from warping, and this makes it possible to suppress the occurrence of a connection failure between the bump 32 and the individual wirings 91 or the common wirings 92.

In addition, in this embodiment, outer surfaces 35b of the adhesive layer 35 opposite to the recessed portion 36 are surfaces along the third direction Z, that is, surfaces vertical to the surface of the passage-forming substrate 10. In this case, the bonded area of the adhesive layer 35 to the passage-forming substrate 10 is wider than the bonded area of the adhesive layer 35 to the driver circuit substrate 30. Here, the outer surfaces 35b of the adhesive layer 35 may be inclined as in the inner surfaces 35a of the recessed portion 36. However, if the outer surfaces 35b are inclined in the same directions as the neighboring inner surfaces 35a of the recessed portion 36, the bonded area of the adhesive layer 35 to the passage-forming substrate 10 is decreased. Instead, if the outer surfaces 35b are inclined in the opposite directions from the inner surfaces 35a of the recessed portion 36, the bonded area of the adhesive layer 35 to the passage-forming substrate 10 is increased, but the adhesive layer 35 may adhere to the active portions of the piezoelectric actuators 300, the regions of the vibration plate 50 on which the active portions are provided, and other regions on the passage-forming substrate 10, and thus may block displacement of the piezoelectric actuators 300 and the vibration plate 50. In order to keep the adhesive layer 35 from adhering to the active portions of the piezoelectric actuators 300 and the regions of the vibration plate 50 on which the active portions are provided, the passage-forming substrate 10 and the driver circuit substrate 30 need to be enlarged. In this embodiment, the inner surfaces 35a of the recessed portion 36 are inclined to overlap the adhesive layer 35 and the bump 32 in the third direction Z, and the outer surfaces 35b are formed along the third direction Z to increase the bonded area of the adhesive layer 35. As a result, bonding strength between the passage-forming substrate 10 and the driver circuit substrate 30 can be enhanced. In addition, the adhesive layer 35 is inhibited from adhering to the active portions of the piezoelectric actuators 300, the regions of the vibration plate 50 on which the active portions are formed, or any other regions, so that an ink ejection failure or deterioration of ejection properties due to the blocking of displacement of the piezoelectric actuators 300 can be suppressed. Moreover, the minimization of the region where the adhesive layer 35 is provided makes it possible to achieve the downsizing of the head.

In this embodiment, the recessed portion 36 formed by the adhesive layer 35 is provided to extend continuously across the individual wirings 91 arranged side by side in the first direction X as illustrated in FIG. 7. As a matter of course, the adhesive layer 35 is not limited to this, in particular. Instead, for example, the adhesive layer 35 may include an extended portion 37 continuously extended between each pair of the individual wirings 91 adjacent to each other in the first direction X as illustrated in FIG. 8. To be more specific, the extended portion 37 of the adhesive layer 35 is provided between each pair of core portions 33 adjacent to each other, and the recessed portion 36 may be provided independently for each individual wiring 91. As illustrated in FIG. 8, if the adhesive layer 35 is provided with the extended portions 37, the bonded areas of the adhesive layer 35 to the passage-forming substrate 10 and the driver circuit substrate 30 are increased, so that the bonding strength between the passage-forming substrate 10 and the driver circuit substrate 30 can be further enhanced. In addition, since the passage-forming substrate 10 and the driver circuit substrate 30 are joined along the entire periphery of each core portion 33, the passage-forming substrate 10 and the driver circuit substrate 30 are inhibited from warping in the recessed portion 36. Incidentally, FIGS. 7 and 8 are perspective views illustrating important portions of the passage-forming substrates 10.

The adhesive layer 35 with which the passage-forming substrate 10 and the driver circuit substrate 30 are joined together as described above forms holder portions 38 between the passage-forming substrate 10 and the driver circuit substrate 30. Each of the holder portions 38 is a space in which the piezoelectric actuators 300 are arranged. In this embodiment, since the adhesive layer 35 is provided continuously around the entire periphery of each array of the piezoelectric actuators 300, the holder portions 38 are provided independently corresponding to the respective arrays of the piezoelectric actuators 300 between the passage-forming substrate 10 and the driver circuit substrate 30. Such holder portions 38 may or may not be sealed hermetically. Incidentally, use of a photosensitive resin as the adhesive layer 35 enables easy and reliable formation of the holder portions 38 as the sealed spaces.

Meanwhile, connection of the driver circuit substrate 30 to an external wiring is not particularly limited. For example, a through electrode may be provided to the driver circuit substrate 30, and the external wiring may be connected to the through electrode on the opposite surface of the driver circuit substrate 30 from the surface facing the passage-forming substrate 10. Instead, a wiring may be provided on the surface of the driver circuit substrate 30 to face the passage-forming substrate 10, and be routed from a region where the driver circuit 31 is formed to the outside of the holder portion 38, and the wiring and the external wiring may be connected outside the holder portion 38. Otherwise, a through hole may be provided in the driver circuit substrate 30, and the external wiring inserted in the through hole may be connected to the driver circuit 31.

In this embodiment, the driver circuit 31 and the piezoelectric actuators 300 can be electrically connected together by directly joining the passage-forming substrate 10 to the driver circuit substrate 30 in which the driver circuit 31 is formed, as described above. Thus, the individual wirings 91 and the common wirings 92 of the piezoelectric actuators 300 arranged at high density can be connected to the driver circuit 31 reliably at low cost.

Here, a method of producing the adhesive layer 35 for joining the passage-forming substrate 10 and the driver circuit substrate 30 is described with reference to FIGS. 9A to 9C.

As illustrated in FIG. 9A, a photosensitive adhesive agent 135 to form the adhesive layer 35 is applied to the entire one surface side of the passage-forming substrate 10, followed by sintering to evaporate a solvent component. Thereafter, a glass mask 200 having an opening portion 201 is placed on top of the photosensitive adhesive agent 135, and is irradiated with ultraviolet rays in an oblique direction. Thus, the photosensitive adhesive agent 135 is irradiated obliquely with the ultraviolet rays not shielded but passing through the opening portion 201, and a portion of the photosensitive adhesive agent 135 obliquely irradiated with the ultraviolet rays is exposed. This obliquely-exposed portion of the photosensitive adhesive agent 135 forms the inner surface 35a of the recessed portion 36.

Next, as illustrated in FIG. 9B, the glass mask 200 is irradiated with ultraviolet rays in a vertical direction. Thus, the photosensitive adhesive agent 135 is irradiated vertically with the ultraviolet rays not shielded but passing through the opening portion 201, and a portion of the photosensitive adhesive agent 135 vertically irradiated with the ultraviolet rays is exposed. This vertically-exposed portion of the photosensitive adhesive agent 135 forms the outer surface 35b of the adhesive layer 35.

Thereafter, the unexposed portion of the photosensitive adhesive agent 135 is removed as illustrated in FIG. 9C, and consequently the adhesive layer 35 is formed with the inclined inner surface 35a formed on one side and the vertical outer surface 35b formed on the other side. The foregoing example is illustrated for the method of producing one line of the adhesive layer 35 forming the recessed portion 36. The other line of the adhesive layer 35 forming the recessed portion 36 can be formed in the same producing method as that in the foregoing example. Thus, use of photoresist processes of forming the adhesive layer 35 by patterning the photosensitive adhesive agent 135 with the glass mask 200 enables easy and highly-accurate formation of the adhesive layer 35. In addition, the highly-accurate formation of the adhesive layer 35 by the photoresist processes enables the adhesive layer 35 to be formed to have such a desired width and position that the adhesive layer 35 can be kept out of contact with the bumps 32.

As illustrated in FIG. 4, a case member 40 is fixed to such a sub-assembly of the passage-forming substrate 10, the driver circuit substrate 30, the communicating plate 15, and the nozzle plate 20, and thereby forms the manifolds 100 communicating with the multiple pressure generation chambers 12. The case member 40 has a substantially same shape in plan view as the foregoing communicating plate 15, and is joined to both the driver circuit substrate 30 and the foregoing communicating plate 15. Specifically, the case member 40 includes a recessed portion 41 on the driver circuit substrate 30 side, and the recessed portion 41 has a depth that allows the passage-forming substrate 10 and the driver circuit substrate 30 to be housed therein. An opening surface of the recessed portion 41 has a wider area than the surface of the driver circuit substrate 30 joined to the passage-forming substrate 10. Then, with the passage-forming substrate 10 and others housed in the recessed portion 41, the opening surface of the recessed portion 41 on the nozzle plate 20 side is sealed by the communicating plate 15. In addition, the case member 40 is provided with third manifold portions 42 on both sides of the recessed portion 41 in the second direction Y, and each formed in a concave shape. This third manifold portion 42, and the first manifold portion 17 and the second manifold portion 18 formed in the communicating plate 15 constitute the manifold 100 in this embodiment.

Here, as a material for the case member 40, a resin, a metal or the like may be used, for example. Incidentally, if the case member 40 is formed by molding a resin material, the mass production at low cost can be achieved.

In addition, the compliance plate 45 is provided on the surface of the communicating plate 15 in which the first manifold portions 17 and the second manifold portions 18 are opened. The compliance plate 45 seals the openings of the first manifold portions 17 and the second manifold portions 18 on the liquid ejecting surface 20a side. In this embodiment, such compliance plate 45 includes a sealing film 46 and a fixed plate 47. The sealing film 46 is made of a flexible thin film (for example, a thin film made of polyphenylene sulfide (PPS), a stainless steel (SUS), or the like and having a thickness of 20 μm or less). The fixed plate 47 is made of a hard material such as metals including a stainless steel (SUS) and the like. Regions of the fixed plate 47 facing the manifolds 100 are removed completely in the thickness direction, thereby forming opening portions 48. Thus, the one surface side of the manifold 100 is a compliance portion 49 which is a flexible portion sealed only by the flexible sealing film 46.

Moreover, introducing ports 44 are provided in the case member 40. The introducing ports 44 communicate with the respective manifolds 100, and supply ink to the respective manifolds 100. In addition, a connection port 43 is provided in the case member 40. In the connection port 43, the opposite surface of the driver circuit substrate 30 from the passage-forming substrate 10 is exposed, and an external wiring not illustrated is inserted. The external wiring inserted in the connection port 43 is electrically connected to the driver circuit substrate 30.

When ejecting ink, the inkjet-type recording head 1 thus configured fills ink in entire passages from the manifolds 100 to the nozzles 21 by taking in the ink through the introducing ports 44 from a liquid reservoir in which the ink is reserved. Then, the inkjet-type recording head 1 applies a voltage to each of the piezoelectric actuators 300 corresponding to the pressure generating chambers 12 in accordance with signals from the driver circuit 31, and thereby deflects the vibration plate 50 together with the piezoelectric actuators 300. This increases pressure inside the pressure generating chambers 12 and causes ink droplets from predetermined ones of the nozzles 21.

Embodiment 2

FIGS. 10A and 10B are cross sectional views of important portions of a head according to Embodiment 2 of the invention. Here, the same components as in Embodiment 1 described above are assigned with the same reference signs and the duplicate explanation thereof is omitted.

As illustrated in FIGS. 10A and 10B, an adhesive layer 35 in this embodiment is provided such that inner surfaces 35a of a recessed portion 36, i.e., the inner surfaces 35a on a bump 32 side are inclined with respect to the third direction Z, and outer surfaces 35c are inclined in the same directions as the neighboring inner surfaces 35a.

The bonded area of such adhesive layer 35 to a passage-forming substrate 10 is the same as in the case where the inner surfaces and the outer surfaces are formed along the third direction Z, or in other words, are formed to be surfaces vertical to the surface of the passage-forming substrate 10. Meanwhile, the bonded positions of the adhesive layer 35 to the passage-forming substrate 10 come closer to the bump 32 than the above latter case. Thus, the adhesive layer 35 can inhibit the passage-forming substrate 10 and a driver circuit substrate 30 within the recessed portions 36 from warping, and thereby suppress a connection failure of the bumps 32 to the individual wirings 91 and the common wirings 92.

Incidentally, also in this embodiment, no adhesive layer 35 may be formed between adjacent bumps 32 as in FIG. 7 in Embodiment 1 described above, or extended portions 37 in which the adhesive layer 35 is extended may be formed between adjacent bumps 32 as in FIG. 8 in Embodiment 1.

Other Embodiments

Embodiments 1 and 2 of the invention have been described above, but the basic configuration of the invention is not limited to those described above.

In Embodiments 1 and 2 described above, the bumps 32 are provided on the driver circuit substrate 30, but the bumps 32 are not limited to this configuration, in particular. The bumps 32 may be provided on the passage-forming substrate 10. In this case, the adhesive layer 35 to face the bumps 32 in the third direction Z may be formed on the driver circuit substrate 30. Meanwhile, for example, the piezoelectric layer 70 of the piezoelectric actuator 300 may be extended more, and the individual wirings 91 and the common wirings 92, provided above the passage-forming substrate 10, on which the bumps 32 and the adhesive layer 35 are to be provided, may be formed on the extended portions of the piezoelectric layer 70. In this configuration, the holder portion 38 between the driver circuit substrate 30 and the passage-forming substrate 10 can have a sufficient height in a third direction Z without needing a recessed portion or the like provided in the driver circuit substrate 30, and thereby the piezoelectric actuators 300 can be inhibited from hitting the driver circuit substrate 30 when being displaced. In addition, this configuration eliminates the necessity to form large bumps 32 or to form the adhesive layer 35 with a wide width in order to make the holder portion 38 have such sufficient height. Thus, the layout areas of the bumps 32 and the adhesive layer 35 can be reduced to achieve the cost reduction and downsizing.

In Embodiments 1 and 2 described above, the bump 32 includes the core portion 33 made of the elastic resin material, and the metal film 34 provided on the surface of the core portion 33. However, the bump 32 is not limited to this configuration, in particular. For example, a bump including a metal core portion thereinside may be used as the bump 32. In the case where the bump including such a metal core portion is used, it is preferable to use a relatively soft material so that the bump can be deformed, and solder alloys, gold (Au), platina (Pt), iridium (Jr), or the like may be used, for example.

Moreover, in Embodiments 1 and 2 described above, the first electrode 60 is used as an individual electrode for each active portion, and the second electrode 80 is used as a common electrode for several active portions. However, these electrodes are not limited to this configuration, in particular. For example, the first electrode may be a common electrode for several active portions, and the second electrode may be an individual electrode for each active portion. Further, in Embodiments 1 and 2 described above, the vibration plate 50 including the elastic film 51 and the insulation film 52 is illustrated. However, the vibration plate 50 is not limited to this configuration, in particular. For example, the vibration plate 50 may be a vibration plate including only any one of the elastic film 51 and the insulation film 52, or a vibration plate including any other film. Instead, the elastic film 51 and the insulation film 52 may not be formed as the vibration plate 50, and only the first electrode 60 may be formed to act as a vibration plate. Otherwise, the piezoelectric actuator 300 itself may serve as the vibration plate practically.

Additionally, in Embodiments 1 and 2 described above, the driver circuit 31 is provided on the surface side of the driver circuit substrate 30 to face the passage-forming substrate 10, but the driver circuit 31 is not limited to this configuration, in particular. For example, the driver circuit 31 may be provided on the opposite surface side of the driver circuit substrate 30 from the passage-forming substrate 10. In this case, through electrodes, for example, through silicon vias (TSV) may be provided to pass through the driver circuit substrate 30 in the third direction Z which is the thickness direction, and the bumps 32 and the driver circuit 31 may be connected via the through electrodes.

Further, in Embodiments 1 and 2 described above, the driver circuit substrate 30 in which the driver circuit 31 is formed by the semiconductor processes is illustrated, but the driver circuit substrate 30 is not limited to this configuration, in particular. For example, the driver circuit substrate 30 does not have to be provided with a switching element such as a transmission gate. In other words, the driver circuit substrate 30 may be a substrate not provided with any switching element but provided with wiring on which a driver circuit provided with a switching element is to be mounted. In short, the driver circuit substrate 30 is not necessarily limited to a substrate in which the driver circuit 31 is integrally formed by the semiconductor processes.

Moreover, in Embodiments 1 and 2 described above, the lines of the adhesive layer 35 are provided on both sides, in the second direction Y, of the bump 32 for connecting the driver circuit 31 and the common wirings 92, but the adhesive layer 35 is not limited to this configuration, in particular. For example, the lines of the adhesive layer 35 do not have to be provided on both sides of the bump 32 to be connected to the common wirings 92. Even in this case, two of the lines of the adhesive layer 35 provided on both sides of the bumps 32 to be connected to the individual wirings 91 are present respectively on both sides of the bump 32 to be connected to the common wirings 92 in Embodiments 1 and 2 described above. Thus, the bump 32 and the common wirings 92 can be reliably connected together without the lines of the adhesive layer 35 provided on both sides of the bump 32.

Additionally, in Embodiments 1 and 2 described above, the driver circuit substrate 30 in a flat-plate shape having a flat surface on the passage-forming substrate 10 side is illustrated, but the driver circuit substrate 30 is not limited to this configuration, in particular. For example, the surface of the driver circuit substrate 30 on the passage-forming substrate 10 side may be provided with a recessed portion at a region to face the piezoelectric actuators 300. In this configuration, the distance between the piezoelectric actuators 300 and the driver circuit substrate 30 is widened, and accordingly the piezoelectric actuators 300 can be inhibited from hitting the driver circuit substrate 30 when being displaced. Incidentally, a preferable method of forming the recessed portion in the driver circuit substrate 30 may be to remove a portion from the driver circuit substrate 30, or to form a protruded portion on the driver circuit substrate 30 by using a resin or by film deposition such that the recessed portion can be formed on the driver circuit substrate 30. If the recessed portion is formed by removing the portion from the driver circuit substrate 30, it is preferable to integrally form the driver circuit 31 on the opposite surface side of the driver circuit substrate 30 from the passage-forming substrate 10, because of a difficulty in forming the driver circuit 31 in the bottom surface of the recessed portion. In addition, as the recessed portion, one recessed portion may be provided to be common to the two arrays of piezoelectric actuators 300, or two recessed portions may be provided for the respective arrays of the piezoelectric actuators 300.

In addition, in Embodiments 1 and 2 described above, the driver circuit substrate 30 and the passage-forming substrate 10 are provided on a one-to-one basis. However, the driver circuit substrate 30 is not limited to this configuration, in particular. For example, the driver circuit substrate 30 may be provided independently for each array of piezoelectric actuators 300. However, with the configuration where the driver circuit substrate 30 and the passage-forming substrate 10 are provided on a one-to-one basis as in Embodiment 1 described above, the number of components can be reduced, and also the number of connection points can be reduced because the driver circuit substrate 30 is connected to the common wirings 92 common to the two arrays of the piezoelectric actuators 300. Thus, the configuration where the driver circuit substrate 30 and the passage-forming substrate 10 are provided on a one-to-one basis as in Embodiment 1 described above leads to further cost reduction and downsizing than otherwise.

Further, in Embodiments 1 and 2 described above, the configuration in which the two arrays of the piezoelectric actuators 300 are arranged in the second direction Y is illustrated. However, the number of arrays of piezoelectric actuators 300 is not limited two, but may be one, three or more.

Here, the inkjet-type recording head 1 of any of these embodiments constitutes a part of an inkjet-type recording head unit including an ink passage communicating with an ink cartridge and others, and is equipped in an inkjet-type recording apparatus. FIG. 11 is a schematic view illustrating one example of the inkjet-type recording apparatus.

In an inkjet-type recording apparatus I illustrated in FIG. 11, a cartridge 2 constituting an ink supply unit is detachably attached to the inkjet-type recording head 1, and a carriage 3 on which the inkjet-type recording head 1 is mounted is provided on a carriage shaft 5 attached to an apparatus main body 4. The carriage 3 is movable in axis directions of the carriage shaft 5.

Then, when a drive force by a driver motor 6 is transmitted to the carriage 3 via multiple gears not illustrated and a timing belt 7, the carriage 3 having the inkjet-type recording head 1 mounted thereon is moved along the carriage shaft 5. On the other hand, the apparatus main body 4 is provided with a conveyor roller 8 as a conveyor unit, and the conveyor roller 8 conveys a recording sheet S which is a recoding medium such as paper. Incidentally, the conveyor unit to convey the recording sheet S is not limited to the conveyor roller but may be any of a belt, a drum and others.

In the inkjet-type recording apparatus I described above, the inkjet-type recording head 1 is mounted on the carriage 3 and is moved in the main scan directions. However, the inkjet-type recording apparatus I is not limited to this configuration, in particular. For example, the invention may be applied to a so-called line-type recording apparatus configured to make print by moving a recording sheet S such as paper in a sub-scan direction with the inkjet-type recording head 1 fixed.

Moreover, in the foregoing example, the inkjet-type recording apparatus I has the configuration in which the cartridge 2 as the liquid reservoir is mounted on the carriage 3, but the liquid reservoir is not limited to this configuration, in particular. For example, a liquid reservoir such as an ink tank may be fixedly provided to the apparatus main body 4, and may be connected to the inkjet-type recording head 1 via a supply pipe such as a tube. Instead, the liquid reservoir does not have to be mounted on the inkjet-type recording apparatus.

The invention widely aims at an overall range of heads, and may be applied to various kinds of recording heads such, for example, as inkjet-type recording heads used in image recording apparatuses such as printers, coloring material jet heads for use in manufacture of color filters for liquid crystal displays and the like, electrode material jet heads for use in electrode formation for organic EL displays, field emission displays (FED), and the like, bio-organic material jet heads for use in biochip production, and other heads.

Furthermore, the invention widely aims at MEMS devices, and may be applied to MEMS devices other than the heads. Examples of the MEMS devices are ultrasonic devices, motors, pressure sensors, power collector elements, ferroelectric elements, and others. Moreover, the MEMS devices also include finished products including the above-listed MEMS devices, such for example, as liquid or material jet apparatuses using the aforementioned heads, ultrasonic sensors using the aforementioned ultrasonic devices, robots using the aforementioned motors as drive sources, IR sensors using the aforementioned power collector elements, and ferroelectric memories using the aforementioned ferroelectric elements.

REFERENCE SIGNS LIST

I: inkjet-type recording apparatus (liquid jet device) 1: inkjet-type recording head (head) 10: passage-forming substrate (secondary substrate) 15: communicating plate 20: nozzle plate 20a: liquid ejecting surface 21: nozzle 30: driver circuit substrate (primary substrate) 31: driver circuit 31a: terminal 32: bump 33: core portion 34: metal film (primary electrode) 35: adhesive layer 36: recessed portion 37: extended portion 38: holder portion 40: case member 45: compliance plate 50: vibration plate 60: first electrode 70: piezoelectric layer 80: second electrode 91: individual wiring (secondary electrode) 92: common wiring 100: manifold 300: piezoelectric actuator (piezoelectric element)

CITATION LIST

Patent Literature

PTL 1: JP-A-2014-51008
PTL 2: JP-A-2009-117544

The invention claimed is:
1. An MEMS device comprising:
a primary substrate provided with a bump including a primary electrode; and
a secondary substrate provided with a secondary electrode on a bottom surface of a recessed portion formed by an adhesive layer,
wherein the primary substrate and the secondary substrate are joined together with the adhesive layer,
wherein the primary electrode is electrically connected to the secondary electrode with the bump inserted into the recessed portion,
wherein part of the bump and the adhesive layer forming the recessed portion overlap each other in a direction in which the bump is inserted into the recessed portion, and
wherein a gap is provided between the adhesive layer and the bump so as to keep the adhesive layer out of contact with the bump, and
wherein one or more surfaces of the adhesive layer forming the recessed portion are inclined toward the secondary substrate side so as to form the gap.
2. The MEMS device according to claim 1, wherein the bump includes an elastic core portion, and a metal film provided on a surface of the core portion.
3. The MEMS device according to claim 2, wherein
the primary substrate is provided with a plurality of the primary electrodes,
the core portion of the bump is provided independently for each of the primary electrodes, and
the adhesive layer is provided between each pair of the core portions adjacent to each other.
4. A head comprising:
the MEMS device according to claim 1;
a pressure generating chamber formed in the secondary substrate and communicating with a nozzle; and
a piezoelectric element attached to a primary substrate side of the secondary substrate, the piezoelectric element connected to the secondary electrode and configured to cause a pressure change in a liquid in the pressure generating chamber.
5. A liquid jet device comprising the head according to claim 4.

6. The MEMS device according to claim 1, wherein the adhesive layer is made of a photosensitive resin.

* * * * *